(12) United States Patent
Liu

(10) Patent No.: US 8,076,744 B2  
(45) Date of Patent: Dec. 13, 2011

(54) PHOTOSENSITIZING CHIP PACKAGE AND MANUFACTURING METHOD THEREOF

(76) Inventor: Chien-Hung Liu, Taoyuan Hsien (TW)

( * ) Notice: Subject to any disclaimer, the term of this patent is extended or adjusted under 35 U.S.C. 154(b) by 175 days.

(21) Appl. No.: 11/657,733

(22) Filed: Jan. 25, 2007

(65) Prior Publication Data

US 2010/0219495 A1 Sep. 2, 2010

(51) Int. Cl.  
*H01L 31/0232* (2006.01)

(52) U.S. Cl. .............. 257/434; 257/432; 257/E31.127; 438/64; 438/65; 438/116

(58) Field of Classification Search .......... 257/432–434, 257/680, E31.127; 438/64, 65, 116  
See application file for complete search history.

(56) References Cited

U.S. PATENT DOCUMENTS

| | | | |
|---|---|---|---|
| 6,441,499 B1 * | 8/2002 | Nagarajan et al. | 257/780 |
| 6,489,675 B1 * | 12/2002 | Gruber et al. | 257/698 |
| 6,844,606 B2 * | 1/2005 | Logsdon et al. | 257/434 |
| 6,856,357 B1 | 2/2005 | Stevenson | |
| 6,962,834 B2 * | 11/2005 | Stark | 438/107 |
| 7,274,101 B2 * | 9/2007 | Tomita et al. | 257/730 |
| 7,282,393 B2 * | 10/2007 | Tarn | 438/116 |
| 7,508,072 B2 * | 3/2009 | Morita et al. | 257/737 |
| 7,808,064 B2 * | 10/2010 | Kawasaki et al. | 257/432 |
| 2006/0071152 A1 * | 4/2006 | Ono | 250/214.1 |
| 2006/0091488 A1 * | 5/2006 | Kang | 257/433 |
| 2008/0061330 A1 * | 3/2008 | Shiau et al. | 257/294 |
| 2008/0170140 A1 * | 7/2008 | Silver et al. | 348/265 |

FOREIGN PATENT DOCUMENTS

WO 2005/004195 1/2005

* cited by examiner

*Primary Examiner* — Allan R Wilson  
(74) *Attorney, Agent, or Firm* — Liu & Liu

(57) ABSTRACT

A photosensitizing chip package construction and manufacturing method thereof is comprised of photosensitizing chips constructed on one side of a wafer using a bonding layer; a color attachment array being disposed over those photosensitizing chips; a glass substrate provided with weir and covered up over the color attachment array; a proper gap being defined between the glass substrate and the color attachment array to promote permeability of stream of light by direct receiving stream of light from those photosensitizing chips constructed over the wafer.

39 Claims, 15 Drawing Sheets

PHOTOSENSITIZING CHIP PACKAGE AND MANUFACTURING METHOD THEREOF

BACKGROUND OF THE INVENTION (a) Field of the Invention

The present invention is related to a photosensitizing chip package construction and manufacturing method thereof, and more particularly, to one that is capable of promoting light permeability and improving resolution.

(b) Description of the Prior Art

With AV multi-media getting popular by day, various types of digital audio systems have been introduced into the market one after another, and image sensor, a core component to these system is also gaining an ever important position. The primary function of the image sensor is to convert audio signals of the light into electric signals. Depending on the type of sensor devices, image sensors are usually divided into two categories of the charge coupled device (CCD) and the complementary metal oxide semiconductor (CMOS). Wherein, CMOS image sensors for giving advantages of lower price, lower power consumption, random readable pixels and high integration extent, are mostly applied in products offered at affordable prices including handset adapted with camera, and webcam.

Referring to FIG. 13 of the accompanying drawings for a sectional view of an image sensor of the prior art, multiple photosensitizing chips 81 of an image sensor 80 are disposed in a base 82, wherein those photosensitizing chips 81 are for example comprised of multiple photo diodes containing multiple p-n junctions in the base 82. In further details, those photosensitizing chips 81 are usually comprised of p-n junctions naturally formed by n-doping area, p-doping area, and where between the n- and p-doping areas in the base 82.

An interconnection layer 84 is disposed on the base 82 and contains many metal interconnections and dialectic layers (not illustrated) among these metal interconnections. These metal interconnections merely are applicable to transmit signals received by those photosensitizing chips 81 to a circuit board 85 for executing subsequent image process. Multiple color attachment films 86 are arranged in array on the interconnection layer 84 and correspond to those photosensitizing chips 81 disposed in the base 82 with each color attachment layer 86 covered with a micro-lens 87 to converge stream of light; a glass substrate 88 is placed over the micro-lens 86 to connect to the interconnection layer 84 by means of a support 89.

External stream of light 91 irradiates into the interconnection layer 84 through the micro-lens 87 and the color attachment film 86 thus to be received by those photosensitizing chips. Therefore, the layout of the metal interconnection in the interconnection layer 84 must duck away the area above those photosensitizing chips 81 to prevent from becoming back stream of light for a metal layer (not illustrated) in the metal interconnection layer to reduce the intensity of the stream of light detected by the photosensitizing chip 81. Accordingly, the manufacturing process involved may tend to be very complicated.

Furthermore, the dielectric layer (not illustrated) in the interconnection layer 84 will also block certain amount of stream of light inputted (i.e., absorbing or reflecting the stream of light) leading to the light intensity in the interconnection layer 84 to decay gradually resulting in insufficient light intensity detected by the photosensitizing chip 81.

SUMMARY OF THE INVENTION

The primary purpose of the present invention is to provide a photosensitizing chip package construction and a manufacturing method thereof to promote permeability of the stream of light and resolution.

To achieve the purpose, one side of a wafer is constructed with multiple photosensitizing chips by means of a bonding layer; a color attachment array is provided over the photosensitizing chip; a glass substrate adapted with weir covers up over the color attachment array; a proper gap is defined by using the glass substrate and the color attachment array; and those photosensitizing chips provided over the wafer are capable of directly receiving stream of light thus to promote the permeability of stream of light.

BRIEF DESCRIPTION OF THE DRAWINGS

FIGS. 10(A) and 10(B) 9 are schematic views showing process steps of providing a second insulation layer in the present invention.

DETAILED DESCRIPTION OF THE PREFERRED EMBODIMENTS

Figure 1:
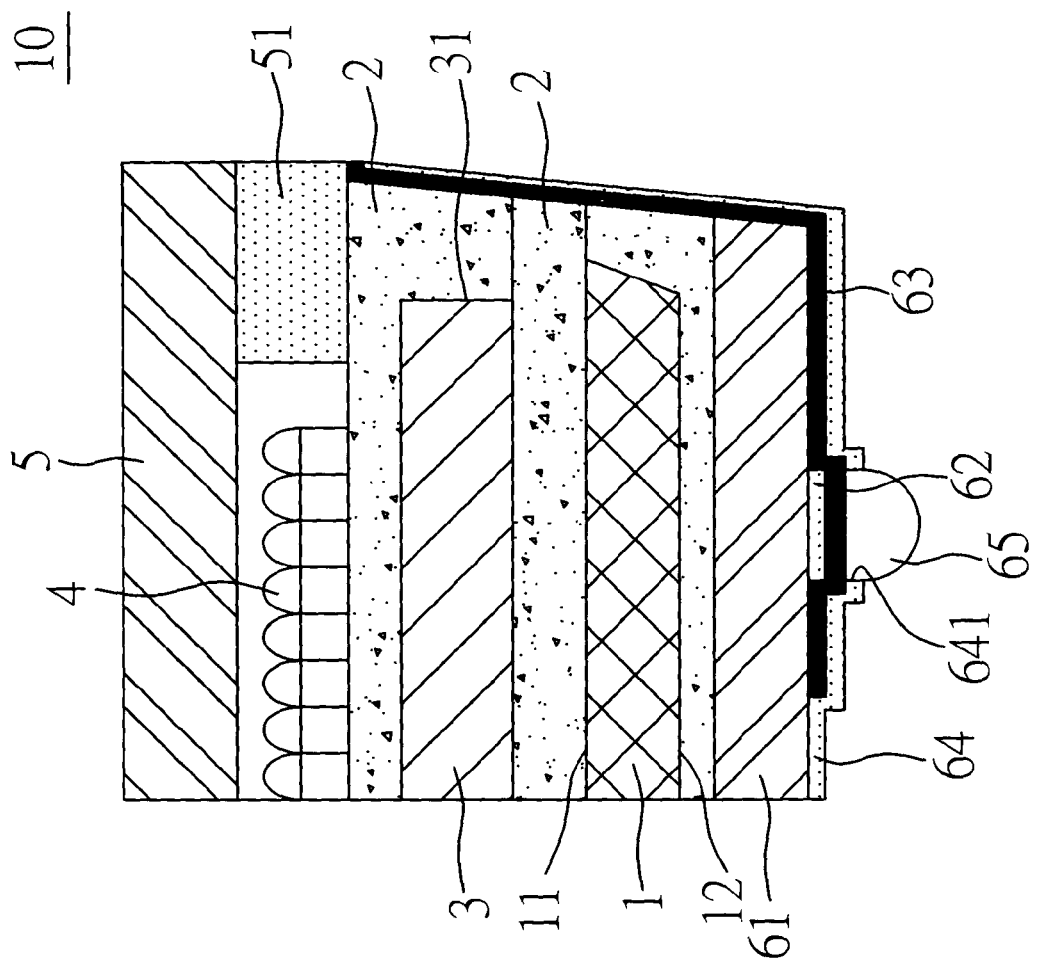
FIG. 1 is a sectional view of a construction of a photosensitizing chip package of the present invention.

The present invention is related to a photosensitizing chip package construction and manufacturing method thereof. Referring to FIG. 1, a photosensitizing chip package construction 10 includes a wafer 1 provided with a first surface 11 and a second surface 12, and the first surface 11 is comprised of a bonding layer 2 and multiple photosensitizing chips 3; an interval 31 is defined among those multiple photosensitizing chips 3, which are disposed on the first surface 11 of the wafer 1 by means of the bonding layer, and a color attachment array 4 is disposed over each photosensitizing chip 3; the color attachment array 4 is each disposed over each photosensitizing chip 3 by means of the bonding layer 2; a glass substrate 5 has on its one side disposed with multiple weirs 51, each weir 51 is disposed over the interval 31 between any two neighboring photosensitizing chips 3, a proper gap is defined between the glass substrate 5 and the color attachment array 4, and the weir 51 relates to a photo-resist material (e.g., solder mask material); and on the second surface 12 of the wafer 1 a substrate 61, a first insulation layer 62, a conducting layer 63, an outmost second insulation layer 64, and multiple circuit pins 65 are constructed in sequence, each circuit pin 65 penetrates through the second insulation layer 64 to contact the conducting layer 63, and further to complete electric connection between the wafer 1 and those circuit pins 65 through the conducting layer while serving as a soldering point to connect the photosensitizing chip package construction 10 and a printed circuit board.

Accordingly, the present invention allows the photosensitizing device to be directly constructed on a wafer thus to reduce blocking of the stream of light for promoting permeability of the stream of light and photosensitizing performance; and in turn providing advantages of promoting resolution and higher pixels.

Figure 2:
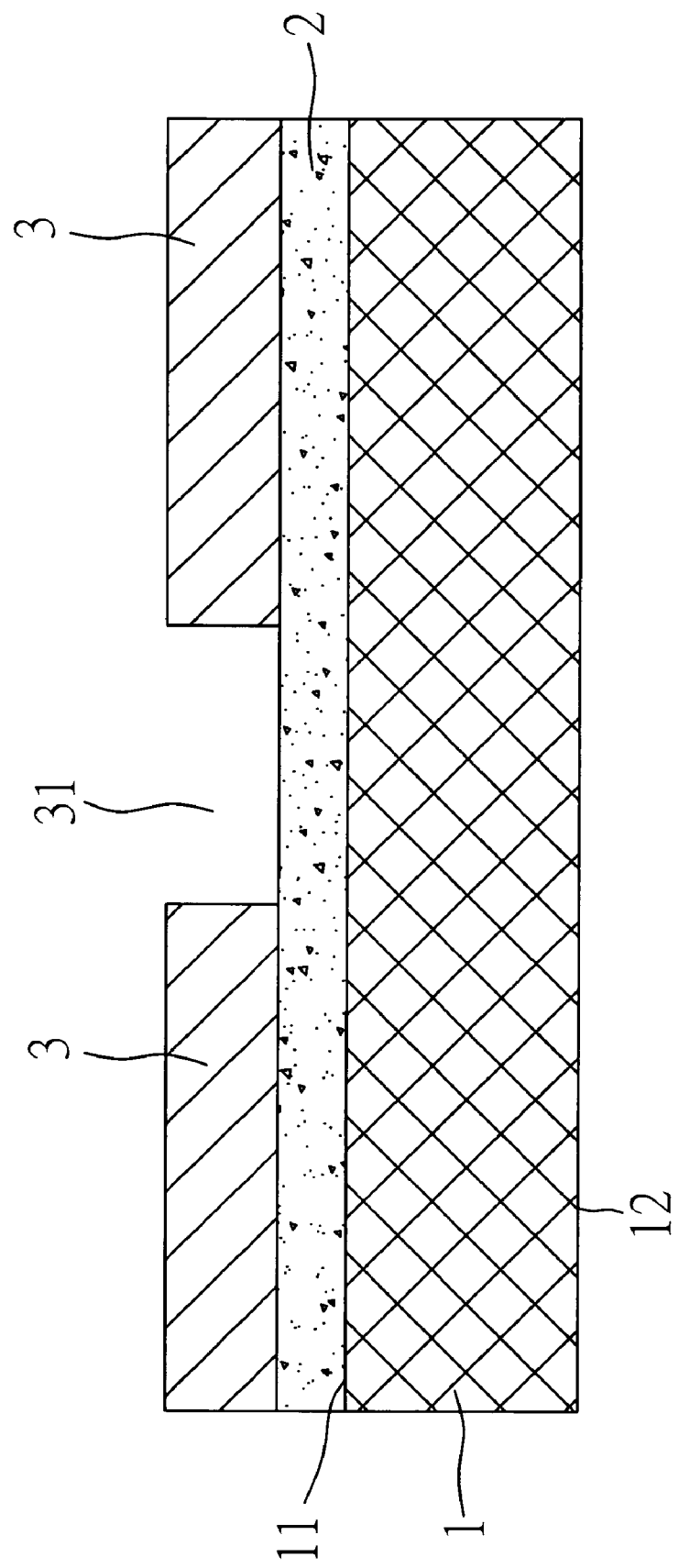
FIG. 2 is a schematic view showing process steps of providing photosensitizing chips of the present invention.
Figure 3:
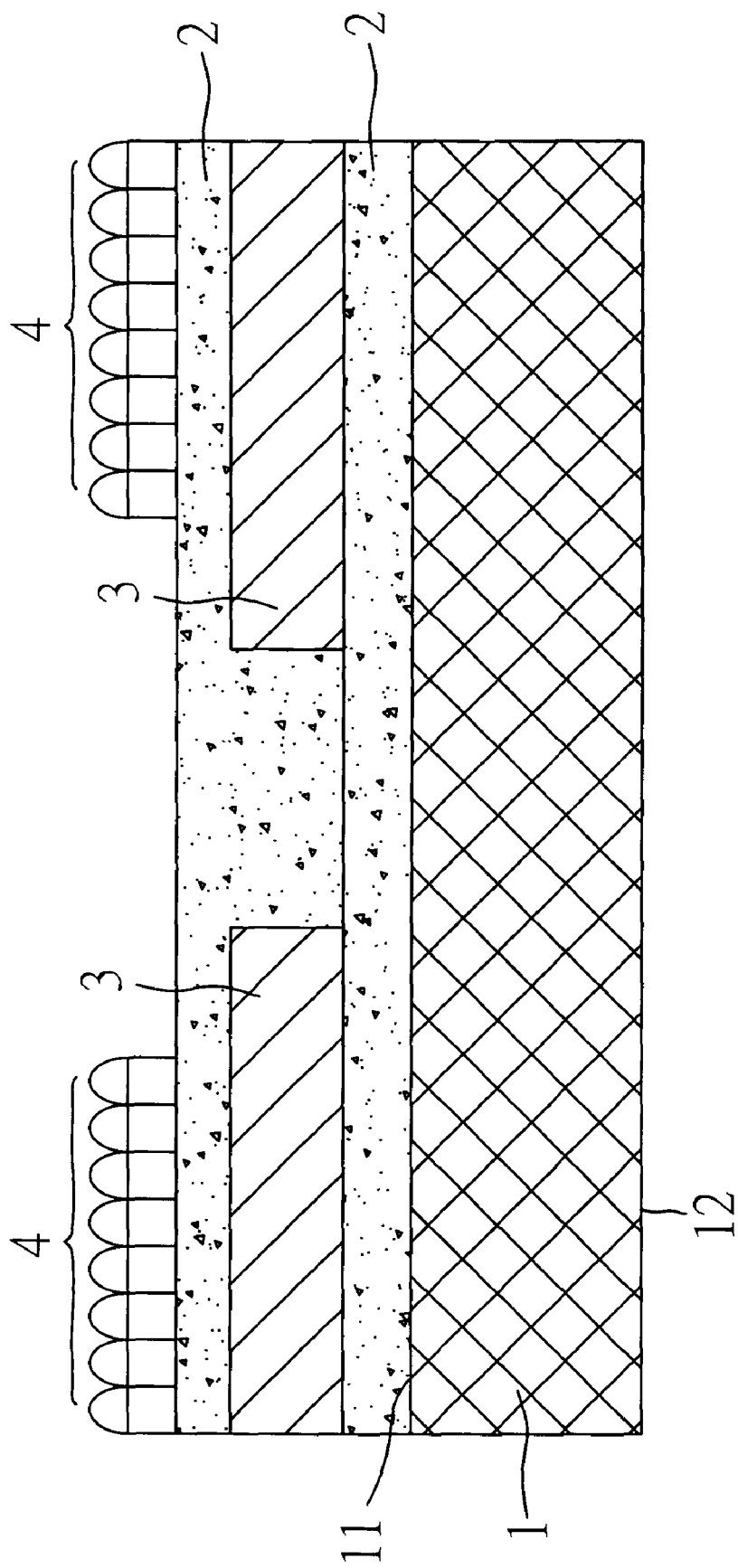
FIG. 3 is a schematic view showing process steps of providing color attachment array to the photosensitizing chips of the present invention.
Figure 4:
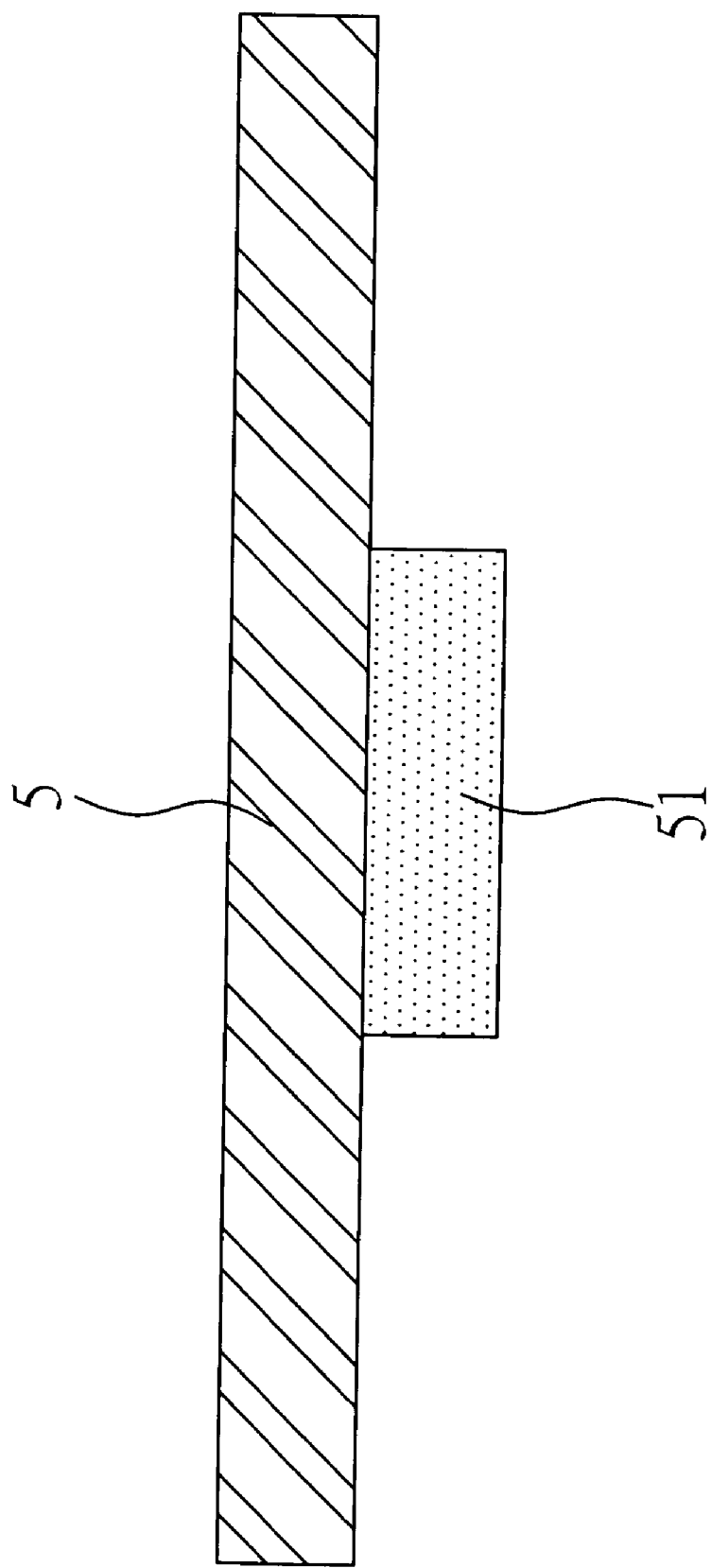
FIG. 4 is a schematic view showing a construction of a glass substrate in the present invention.
Figure 5:
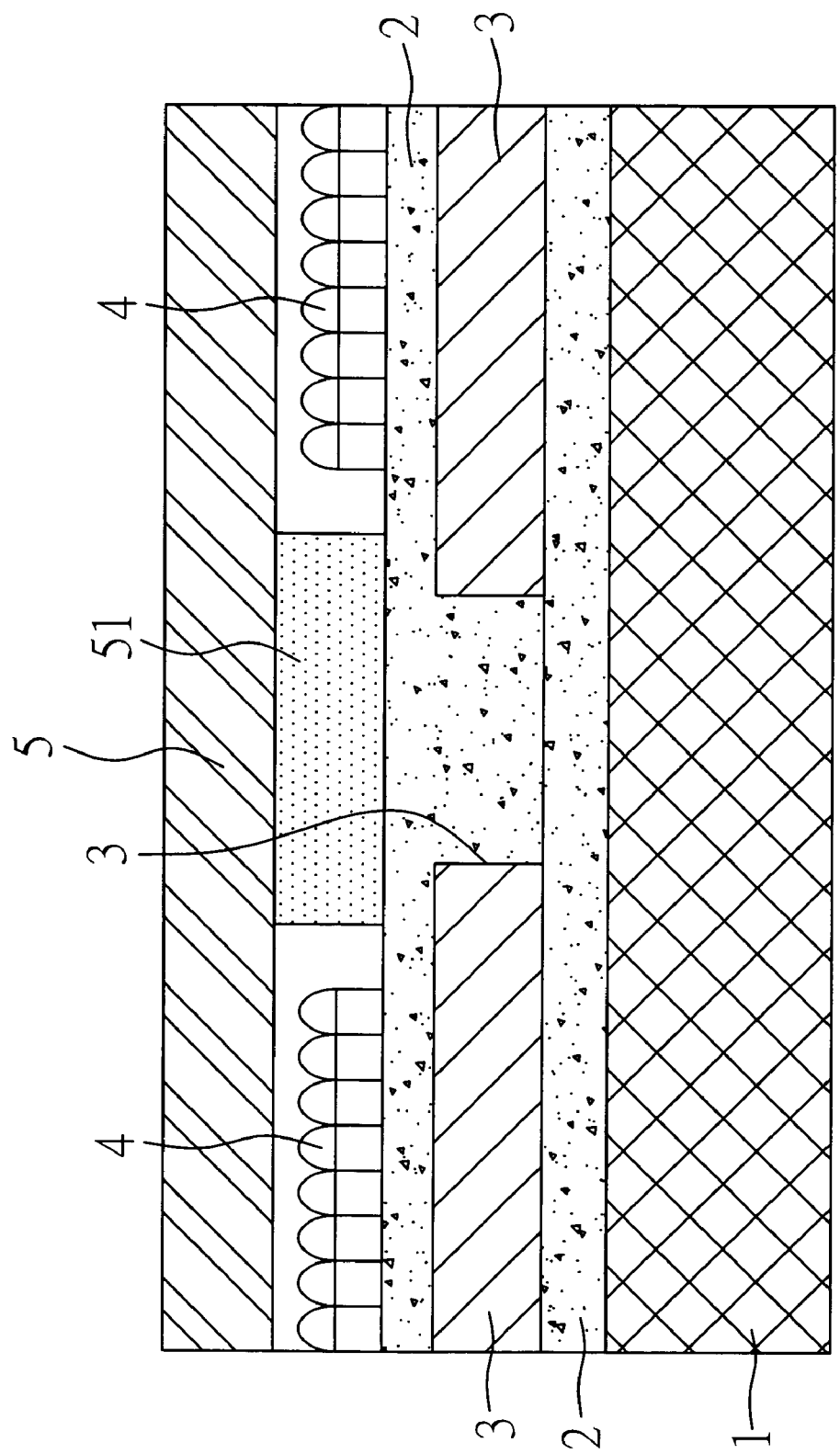
FIG. 5 is a schematic view showing process steps of covering the glass substrate over the color attachment array.
Figure 6:
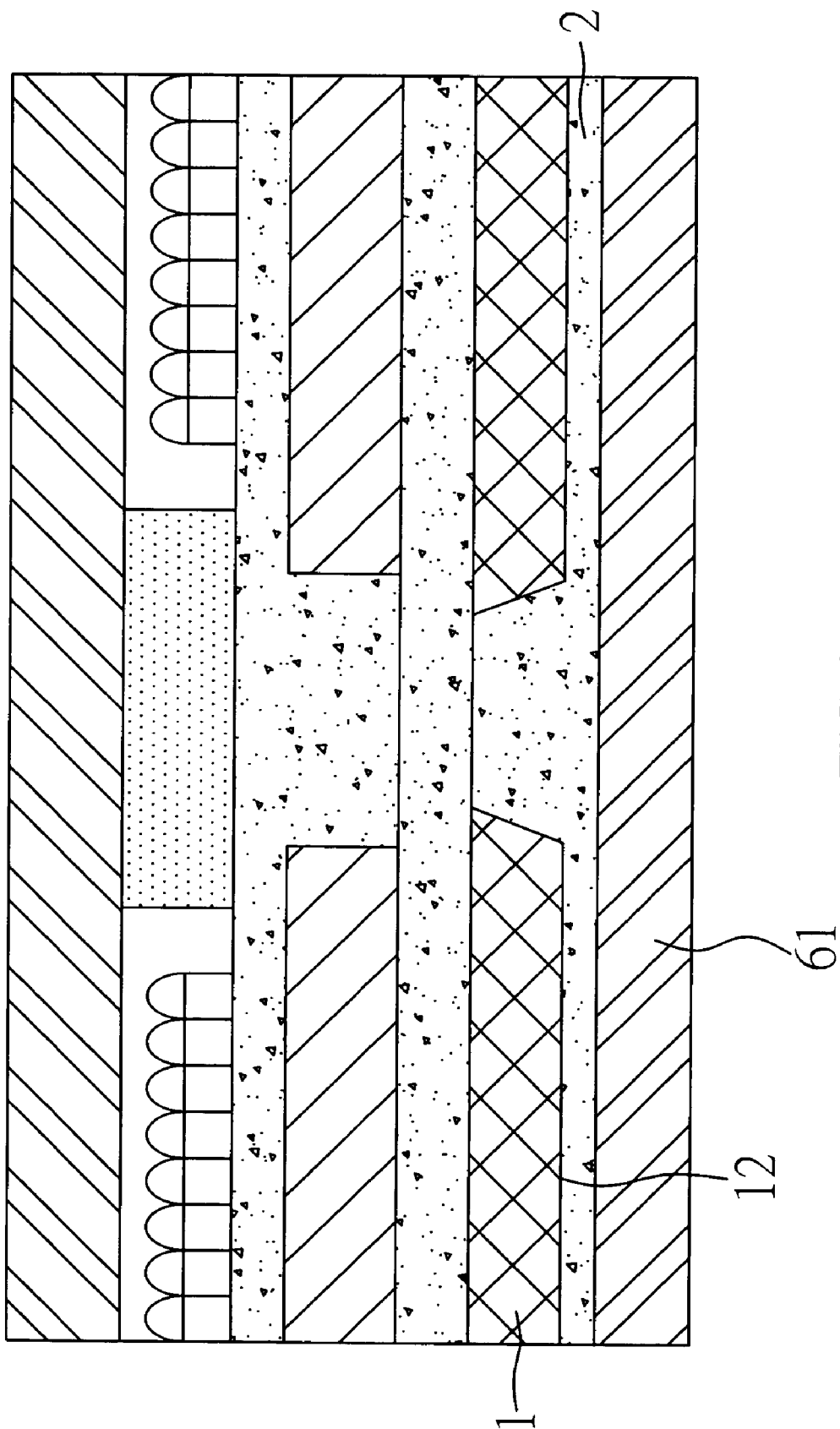
FIG. 6 is a schematic view showing process steps of substrate adhesion in the present invention.
Figure 7A:
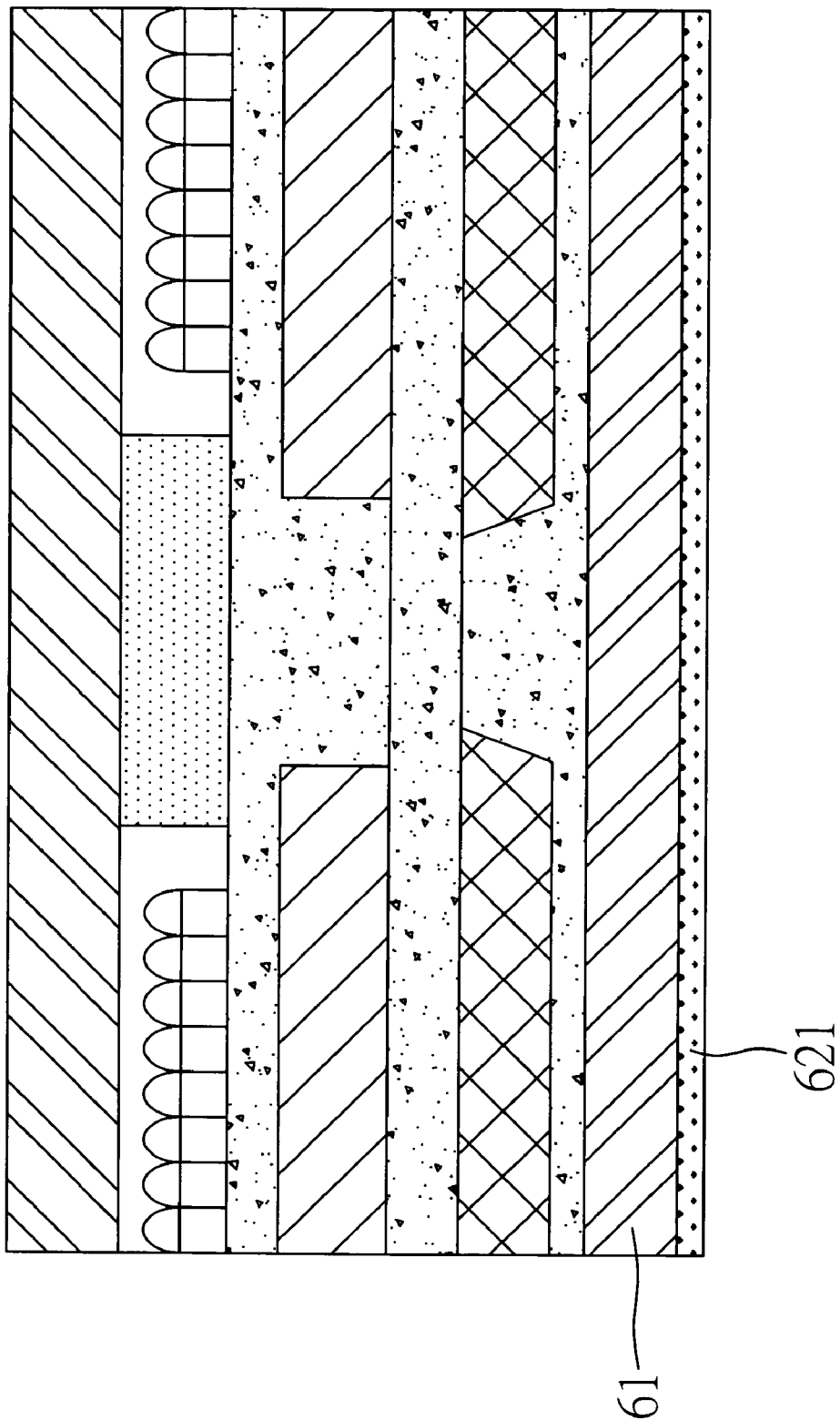
FIGS. 7(A) and 7(B) are schematic views showing process steps of constructing a first insulation layer in the present invention.
Figure 7B:
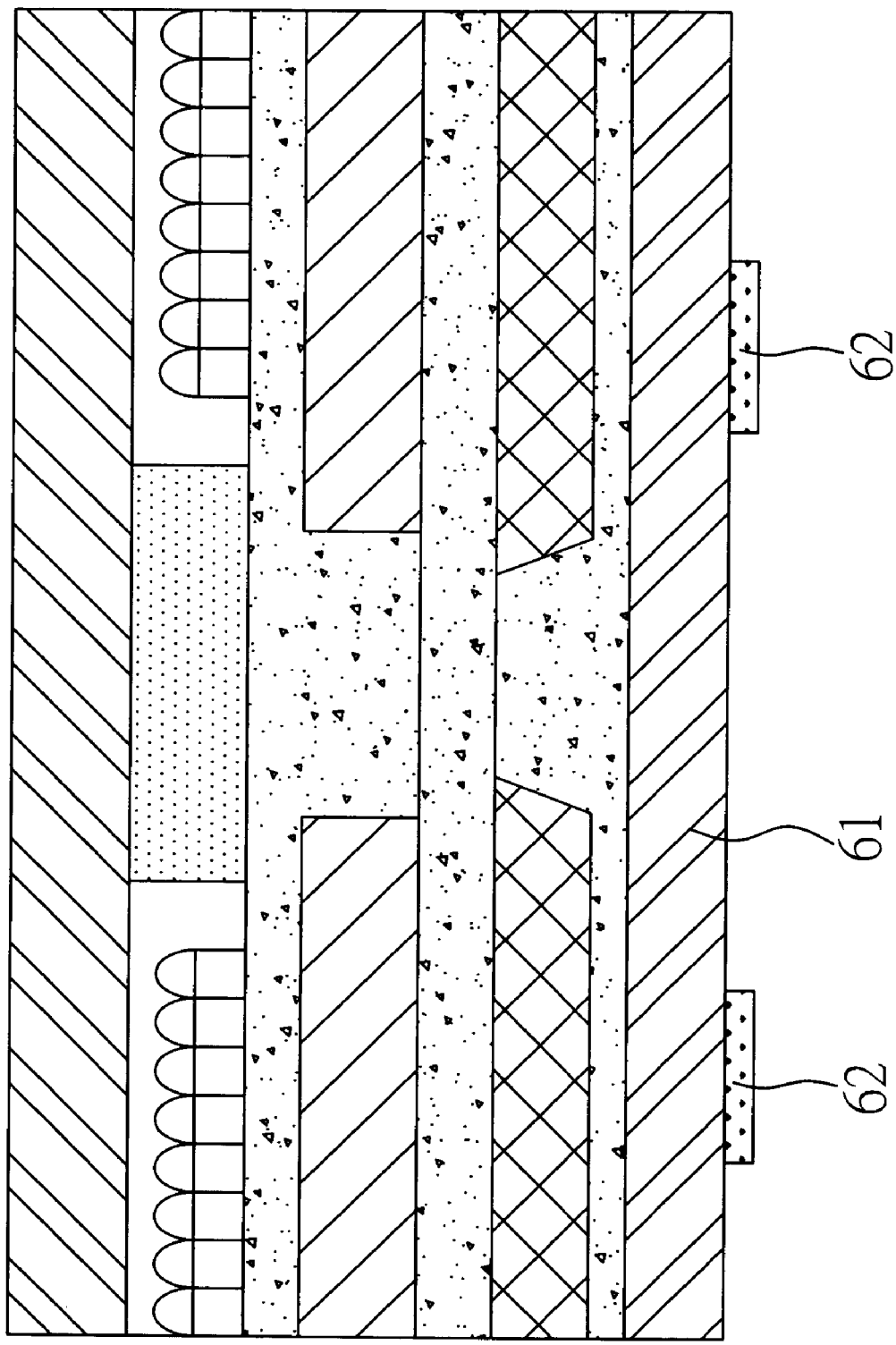
Figure 8:
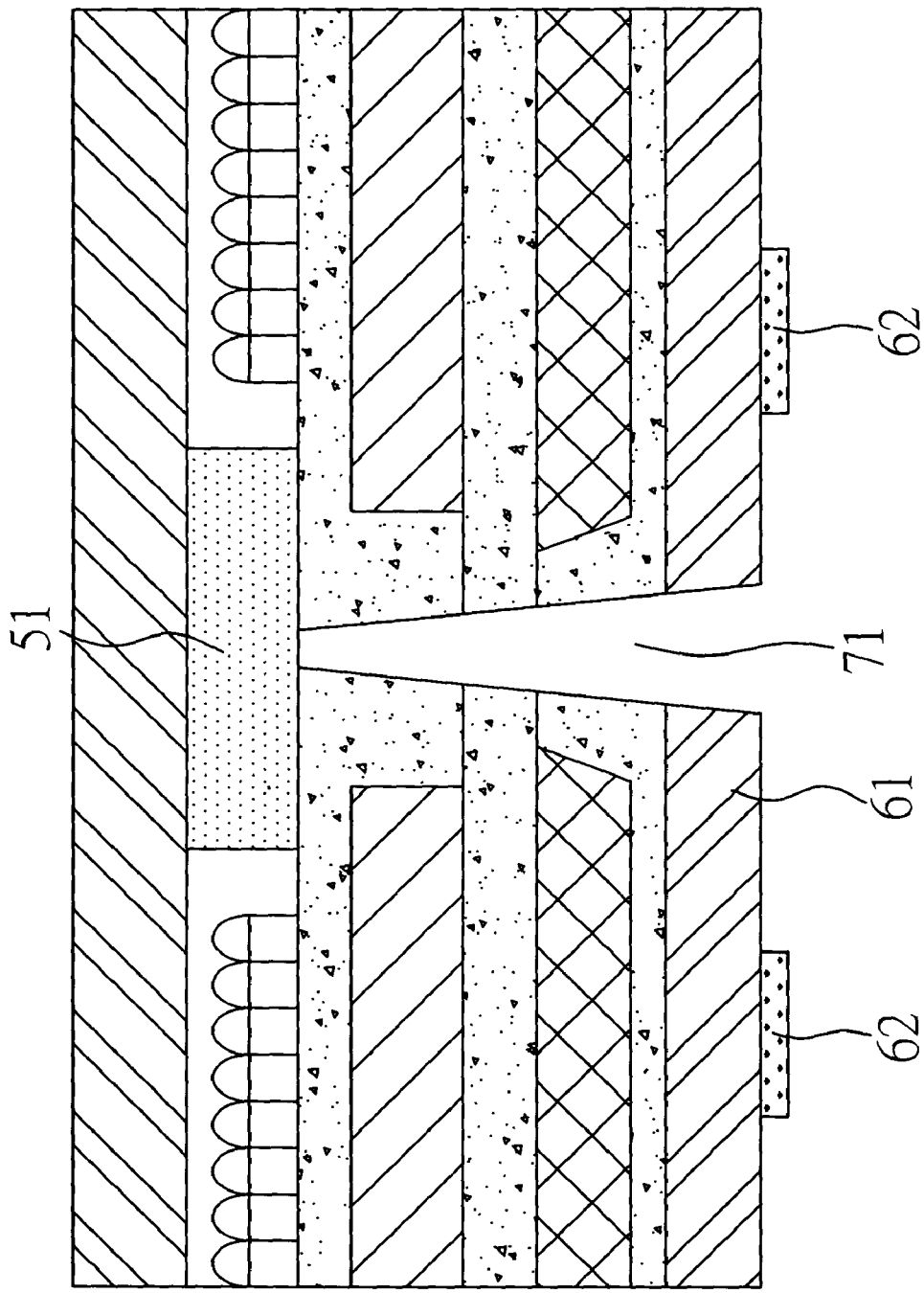
FIG. 8 is a schematic view showing process steps of providing a first cutting in the present invention.
Figure 9:
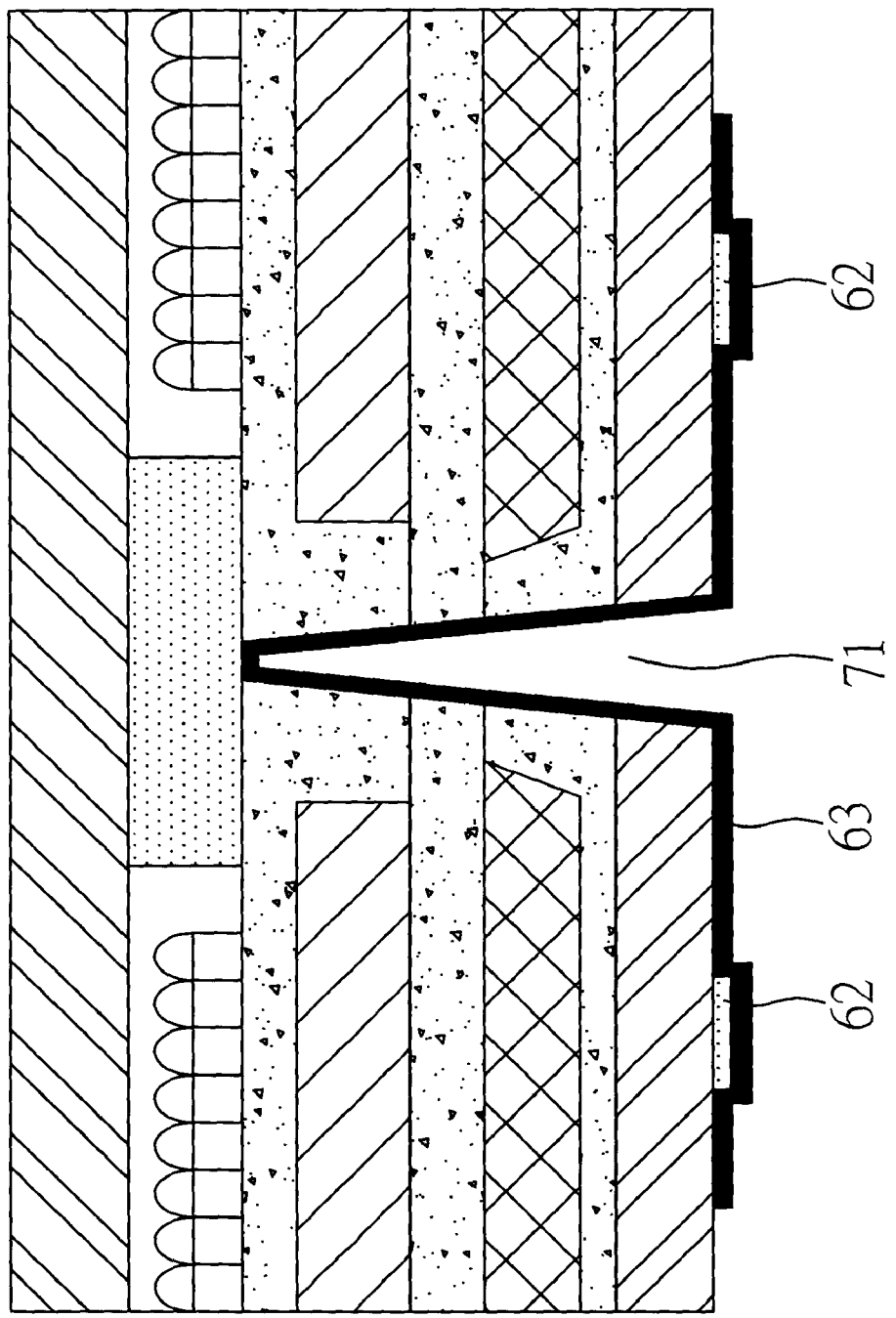
FIG. 9 is a schematic view showing process steps of providing a conducting layer in the present invention.
Figure 10A:
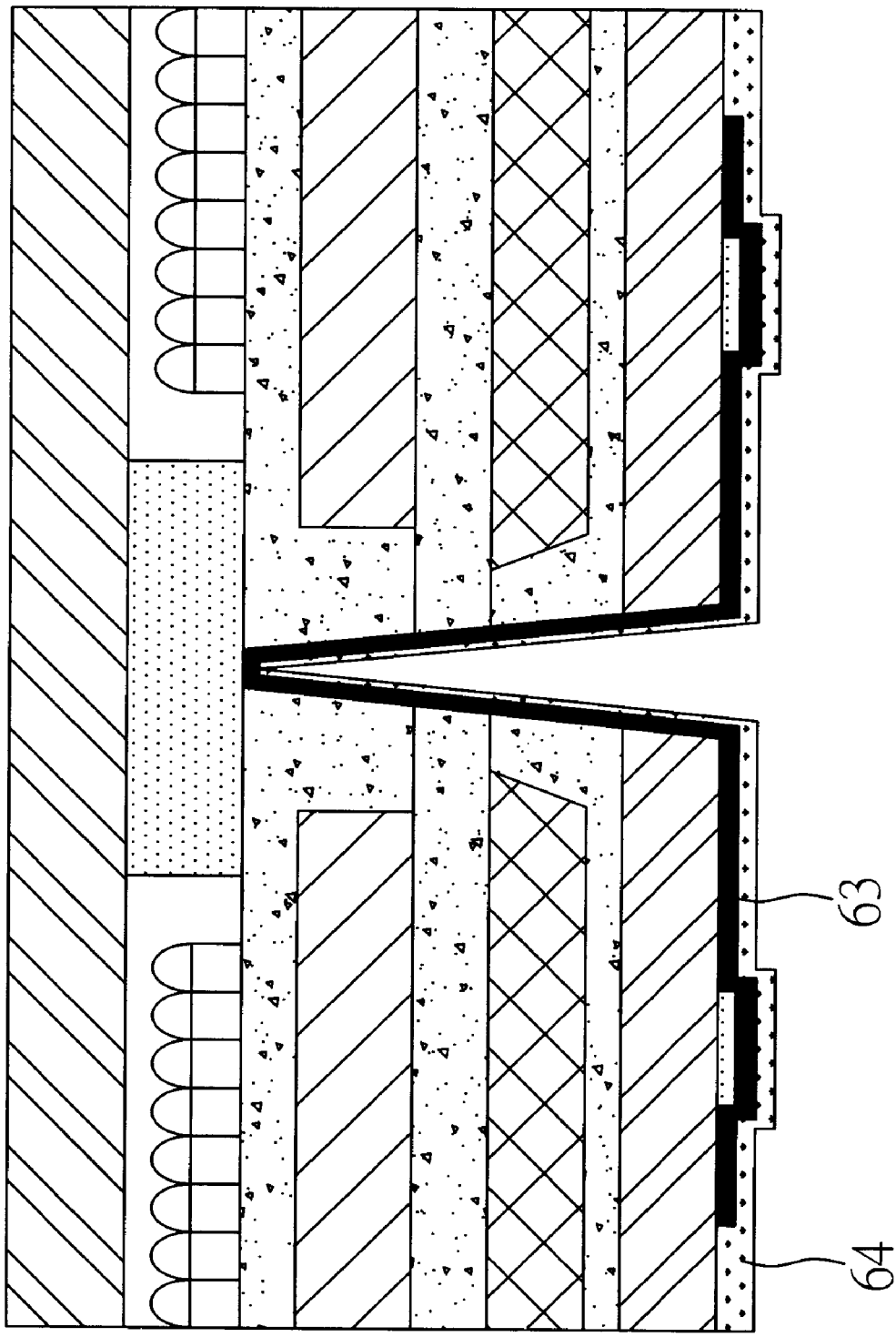
Figure 10B:
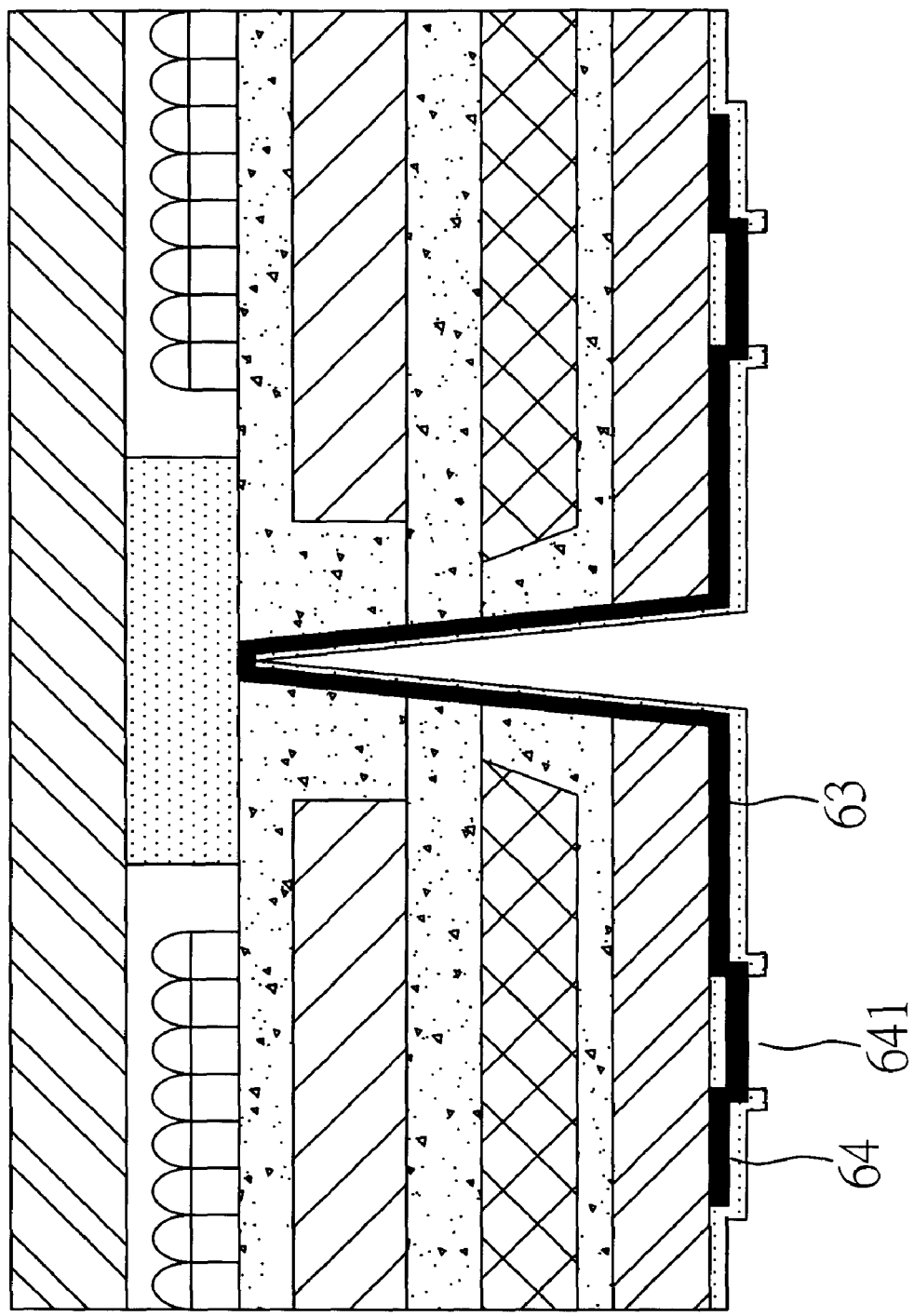
Figure 11:
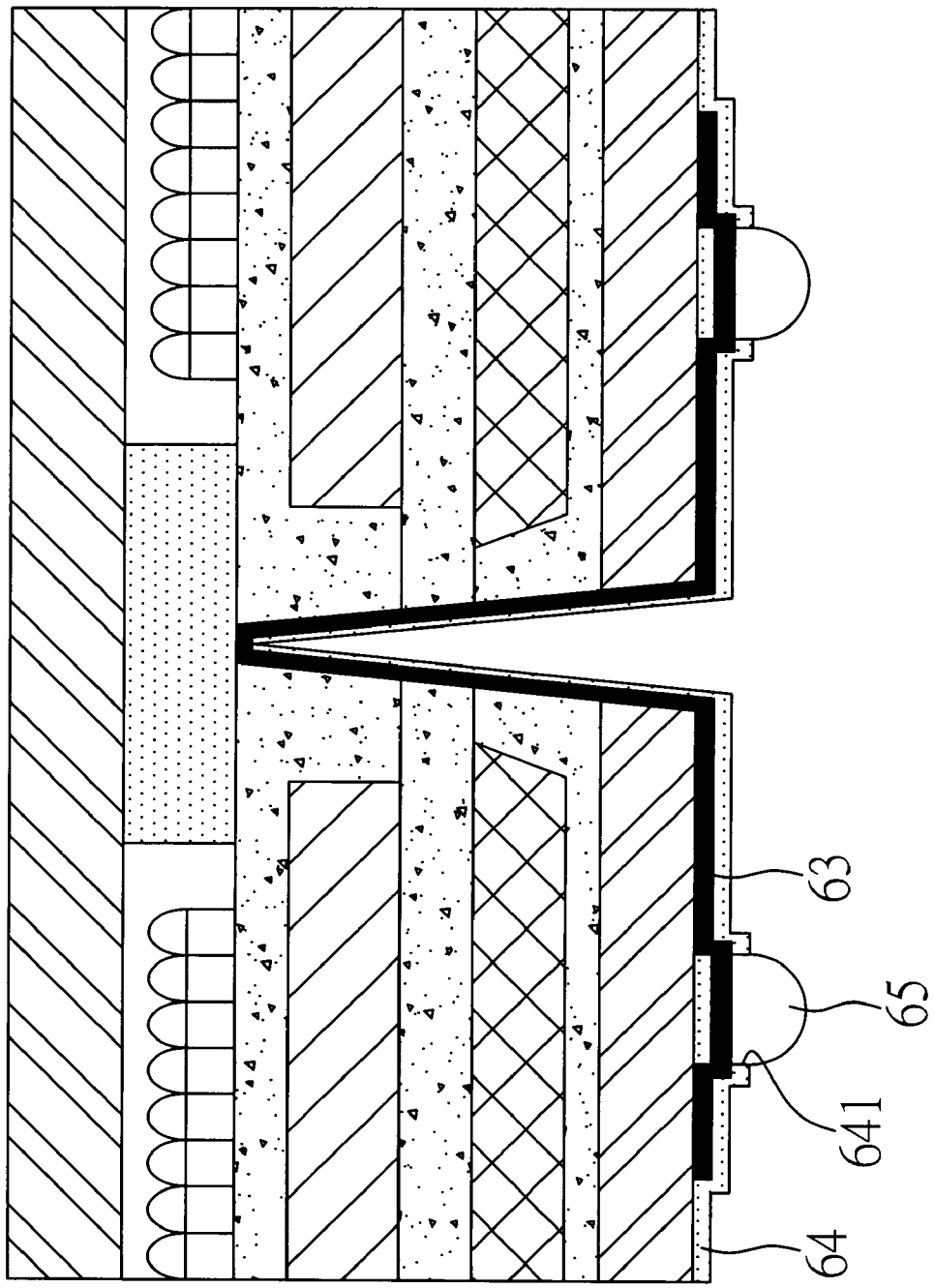
FIG. 11 is a schematic view showing process steps of providing circuit pins in the present invention.
Figure 12:
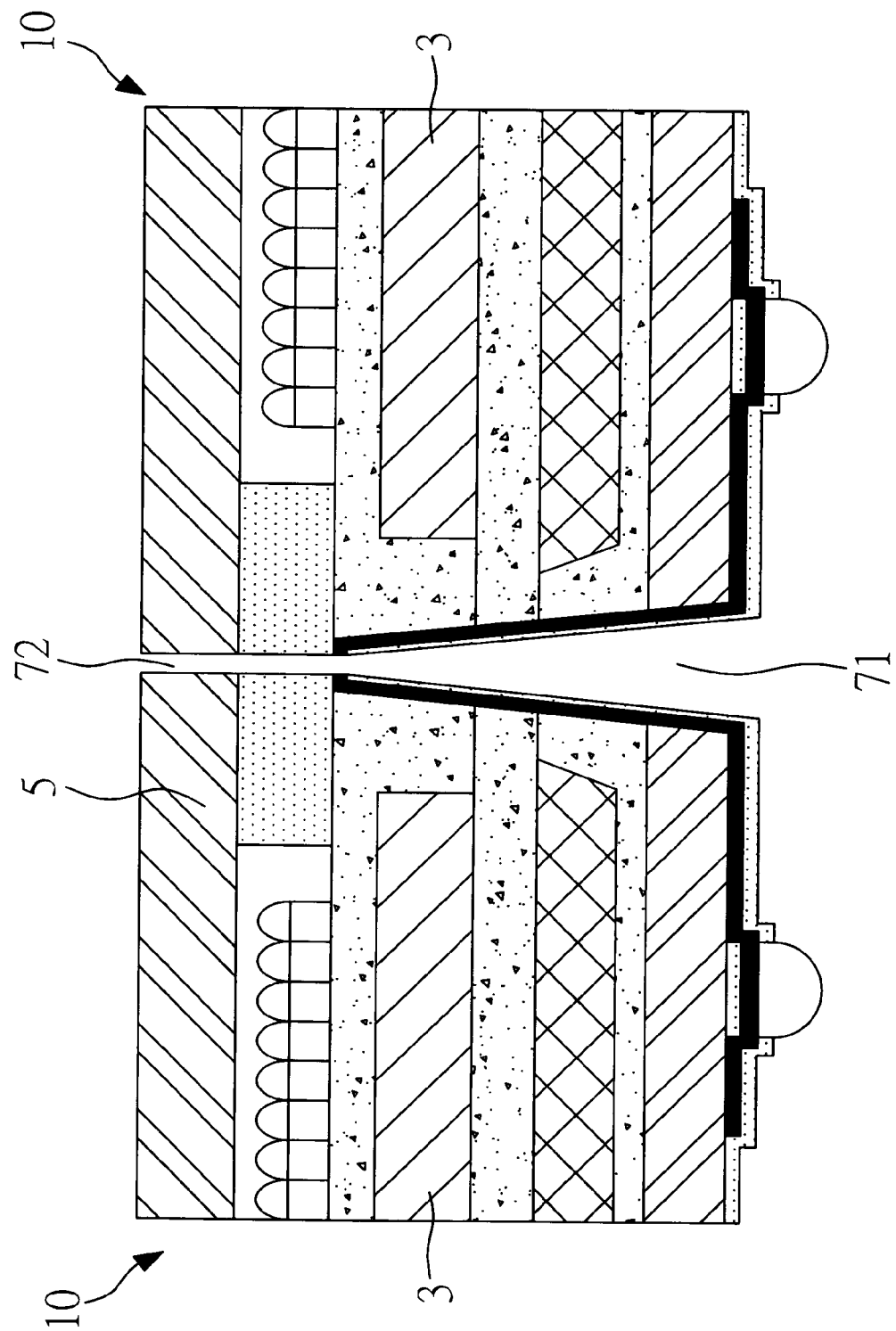
FIG. 12 is a schematic view showing process steps of providing a second cutting in the present invention.
Figure 13:
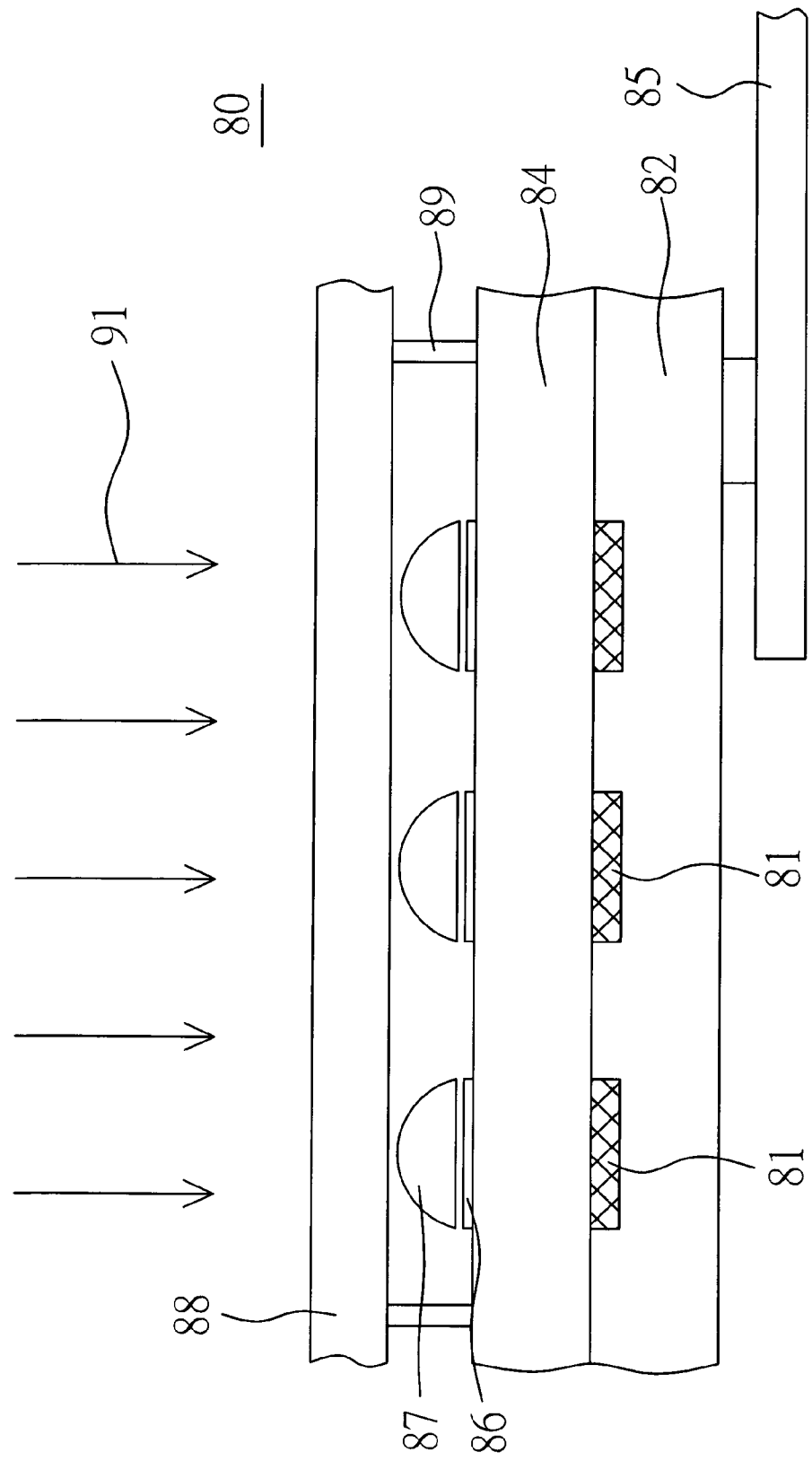
FIG. 13 is a sectional view of an image sensor of the prior art.

Now referring to FIGS. 2 through 12 for a packaging process flow of the entire photosensitizing chip package construction 10. The process flow includes the following steps in sequence:

a. The bonding layer 2 is disposed on the first surface 11 of the wafer 1; multiple photosensitizing chips 3 are constructed on the bonding layer 2 as illustrated in FIG. 2; and the interval 31 is defined between any two neighboring photosensitizing chips 3;

b. The color attachment array 4 is provided on those photosensitizing chips 3 by means of the bonding layer 2 as illustrated in FIG. 3;

c. The glass substrate 5 disposed with multiple weirs 51 is provided as illustrated in FIG. 4, wherein, the glass substrate 5 is disposed with multiple weirs 51 on one side;

d. The glass substrate 5 covers up over the color attachment array 4 as illustrated in FIG. 5 with each weir 51 disposed at where the interval 31 is provided, and a proper gap is defined between the glass substrate 5 and the color attachment 4 by means of the weir 51;

e. As illustrated in FIG. 6, a substrate 61 is adhered to the second surface 12 of the wafer 1 in opposition to those photosensitizing chips 3 by means of the bonding layer 2 and the substrate 61 is related to vitreous material;

f. Step to construct the first insulation layer is as illustrated in FIGS. 7(A) and 7(B) includes coating of an insulation material 621 related to photo-resist or resin on the substrate 61, followed with proper flattening process before developing by exposure to form a first insulation layer 62 on a specific location on the substrate 61;

g. The first cutting step as illustrated in FIG. 8 includes formation of a first groove 71 on the substrate 61 at where different from where the first insulation layer 62 is formed, and the depth of the first groove 71 is preferred to such that it contacts or extends into the weir 51;

h. The construction of the conducting layer as illustrated in FIG. 9 involves coating a course of a metallic material serving as the package conducting layer 63 on the bottom of the first insulation layer 62, and the conducting layer 63 extends further to reach the surface of the first groove 71;

i. The construction for the second insulation layer as illustrated in FIGS. 10(A) and 10(B) involves formation of a second insulation layer 64 by applying a coating of insulation material on the bottom of the conducting layer 63, the second insulation layer 64 is also related to photo-resist or resin, and a channel 641 is constructed by exposure and development processes for achieving the connection between the conducting layer 63 and the circuit pin;

j. As illustrated in FIG. 11, multiple circuit pins are provided, multiple circuit pins 65 are disposed on the channel 641 to penetrate through the second insulation layer 64 to contact the conducting layer 63, and further to constitute electric connection between the wafer and those circuit pins 65 through the conducting layer 63 while serving soldering point for connecting the photosensitizing chip package construction to a printed circuit board; and k. The step of the second cutting as illustrated in FIG. 12 involves formation of a second groove 72 at the first groove 71 to extend into the glass substrate 5 so to separate those photosensitizing chips 3 so to make each photosensitizing chip package structure 10 to become an integral unit. It is to be noted that this step may be omitted if the photosensitizing chip package construction 10 is individually packed.

The prevent invention provides an improved structure of a photosensitizing chip package construction and manufacturing method thereof, and the application for a utility patent is duly filed accordingly. However, it is to be noted that the preferred embodiments disclosed in the specification and the accompanying drawings are not limiting the present invention; and that any construction, installation, or characteristics that is same or similar to that of the present invention should fall within the scope of the purposes and claims of the present invention.

I claim:

1. A photosensitizing chip package, comprising:
a substrate having a first surface and a second surface;
a photosensitizing chip disposed overlying the first surface of the substrate, wherein the photosensitizing chip has a top surface not facing towards the first surface of the substrate, and wherein the top surface of the photosensitizing chip is higher than uppermost plane of the first surface of the substrate;
a bonding layer disposed between the photosensitizing chip and the first surface of the substrate;
a transparent substrate disposed overlying the photosensitizing chip and the first surface of the substrate;
a soldering point formed overlying the second surface of the substrate; and
a conducting layer electrically connecting the soldering point and the photosensitizing chip, wherein there is no metal layer between the transparent substrate and the photosensitizing chip.

2. The photosensitizing chip package as claimed in claim 1, wherein the first surface of the substrate is the uppermost plane of the substrate, and the first surface of the substrate is a substantially planar surface.

3. The photosensitizing chip package as claimed in claim 1, further comprising a color attachment array disposed over the photosensitizing chip.

4. The photosensitizing chip package as claimed in claim 3, wherein the color attachment array is disposed over the photosensitizing chip by means of a bonding layer.

5. The photosensitizing chip package as claimed in claim 1, further comprising a weir disposed between the substrate and the transparent substrate.

6. The photosensitizing chip package as claimed in claim 5, wherein the weir comprises a photo-resist material.

7. The photosensitizing chip package as claimed in claim 6, wherein the photo-resist material comprises a solder mask material.

8. The photosensitizing chip package as claimed in claim 5, wherein a gap is defined between the transparent substrate and the photosensitized chip.

9. The photosensitizing chip package as claimed in claim 1, wherein the conducting layer is formed overlying the second surface of the substrate.

10. The photosensitizing chip package as claimed in claim 9, further comprising an insulation layer disposed overlying the conducting layer and the second surface of the substrate, wherein the soldering point penetrates through the insulation layer to electrically contact the conducting layer.

11. The photosensitizing chip package as claimed in claim 1, further comprising a second substrate disposed overlying the second surface of the substrate.

12. The photosensitizing chip package as claimed in claim 11, wherein the second substrate comprises a vitreous material.

13. The photosensitizing chip package as claimed in claim 11, wherein the conducting layer and the soldering point are both disposed overlying a back surface of the second substrate.

14. The photosensitizing chip package as claimed in claim 13, wherein the conducting layer extends overlying a sidewall of the second substrate.

15. The photosensitizing chip package as claimed in claim 1, wherein the photosensitizing chip has a width shorter than that of the substrate.

16. The photosensitizing chip package as claimed in claim 1, wherein the substrate and the photosensitizing chip are not part of a same wafer structure.

17. The photosensitizing chip package as claimed in claim 1, further comprising a weir disposed between the photosensitizing chip and the transparent substrate.

18. The photosensitizing chip package as claimed in claim 17, wherein the conducting layer extends to contact the weir.

19. The photosensitizing chip package as claimed in claim 18, wherein the conducting layer extends into the weir.

20. The photosensitizing chip package as claimed in claim 17, further comprising a bonding layer between the weir and the photosensitizing chip.

21. A photosensitizing chip package, comprising:
a substrate having a first surface and a second surface;
a photosensitizing chip disposed overlying the first surface of the substrate, wherein the photosensitizing chip has a top surface not facing towards the first surface of the substrate, and wherein the top surface of the photosensitizing chip is higher than uppermost plane of the first surface of the substrate;
a color attachment array disposed over the photosensitizing chip;
a bonding layer disposed between the photosensitizing chip and the first surface of the substrate;
a transparent substrate disposed overlying the photosensitizing chip and the first surface of the substrate;
a soldering point formed overlying the second surface of the substrate; and
a conducting layer electrically connecting the soldering point and the photosensitizing chip, wherein there is no metal layer formed on at least an area of the color attachment array between the transparent substrate and the photosensitizing chip.

22. The photosensitizing chip package as claimed in claim 21, wherein the first surface of the substrate is the uppermost plane of the substrate, and wherein the first surface of the substrate is a substantially planar surface.

23. The photosensitizing chip package as claimed in claim 21, wherein the color attachment array is disposed over the photosensitizing chip by means of a bonding layer.

24. The photosensitizing chip package as claimed in claim 21, further comprising a weir disposed between the substrate and the transparent substrate.

25. The photosensitizing chip package as claimed in claim 24, wherein the weir comprises a photo-resist material.

26. The photosensitizing chip package as claimed in claim 25, wherein the photo-resist material comprises a solder mask material.

27. The photosensitizing chip package as claimed in claim 24, wherein a gap is defined between the transparent substrate and the photosensitized chip.

28. The photosensitizing chip package as claimed in claim 21, wherein the conducting layer is formed overlying the second surface of the substrate.

29. The photosensitizing chip package as claimed in claim 28, further comprising an insulation layer disposed overlying the conducting layer and the second surface of the substrate, wherein the soldering point penetrates through the insulation layer to electrically contact the conducting layer.

30. The photosensitizing chip package as claimed in claim 21, further comprising a second substrate disposed overlying the second surface of the substrate.

31. The photosensitizing chip package as claimed in claim 30, wherein the second substrate comprises a vitreous material.

32. The photosensitizing chip package as claimed in claim 30, wherein the conducting layer and the soldering point are both disposed overlying a back surface of the second substrate.

33. The photosensitizing chip package as claimed in claim 32, wherein the conducting layer extends overlying a sidewall of the second substrate.

34. The photosensitizing chip package as claimed in claim 21, wherein the photosensitizing chip has a width shorter than that of the substrate.

35. The photosensitizing chip package as claimed in claim 21, wherein the substrate and the photosensitizing chip are not part of a same wafer structure.

36. The photosensitizing chip package as claimed in claim 21, further comprising a weir disposed between the photosensitizing chip and the transparent substrate.

37. The photosensitizing chip package as claimed in claim 36, wherein the conducting layer extends to contact the weir.

38. The photosensitizing chip package as claimed in claim 37, wherein the conducting layer extends into the weir.

39. The photosensitizing chip package as claimed in claim 36, further comprising a bonding layer between the weir and the photosensitizing chip.

\* \* \* \* \*